(12) United States Patent
Kim et al.

(10) Patent No.: US 12,101,967 B2
(45) Date of Patent: Sep. 24, 2024

(54) DISPLAY DEVICE

(71) Applicant: Samsung Display Co., Ltd., Yongin-Si (KR)

(72) Inventors: Keunwoo Kim, Seongnam-si (KR); Meejae Kang, Suwon-si (KR); Thanh Tien Nguyen, Hwaseong-si (KR); Hyena Kwak, Hwaseong-si (KR); Jaehwan Chu, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 461 days.

(21) Appl. No.: 17/471,849

(22) Filed: Sep. 10, 2021

(65) Prior Publication Data

US 2022/0181420 A1  Jun. 9, 2022

(30) Foreign Application Priority Data

Dec. 8, 2020 (KR) ........................ 10-2020-0170635

(51) Int. Cl.
*H10K 59/121* (2023.01)
*H10K 59/124* (2023.01)
*H10K 59/131* (2023.01)

(52) U.S. Cl.
CPC ....... *H10K 59/1216* (2023.02); *H10K 59/124* (2023.02); *H10K 59/131* (2023.02)

(58) Field of Classification Search
CPC ............. H10K 59/1216; H10K 59/124; H10K 59/131; H10K 59/1213; G09G 3/3225; H01L 27/124; H01L 27/1248
See application file for complete search history.

(56) References Cited

U.S. PATENT DOCUMENTS

| 10,482,817 | B2 | 11/2019 | Kim et al. | |
|---|---|---|---|---|
| 2016/0043349 | A1* | 2/2016 | Park | H10K 59/12 257/40 |
| 2017/0162602 | A1* | 6/2017 | Saitoh | H01L 29/24 |
| 2018/0197475 | A1* | 7/2018 | Yang | H10K 59/1216 |
| 2019/0115412 | A1* | 4/2019 | Cha | H10K 59/1216 |

FOREIGN PATENT DOCUMENTS

| CN | 108154846 A | 6/2018 |
|---|---|---|
| KR | 1020190042124 A | 4/2019 |
| KR | 1020190082355 A | 7/2019 |
| KR | 1020200045102 A | 5/2020 |

\* cited by examiner

*Primary Examiner* — Farun Lu
*Assistant Examiner* — Sandra Milena Rodriguez Villan
(74) *Attorney, Agent, or Firm* — CANTOR COLBURN LLP

(57) ABSTRACT

A display device may include a substrate, a first transistor disposed on the substrate and including a first gate electrode, a first conductive pattern disposed on the first gate electrode such that the first conductive pattern and the first gate electrode constitute a first capacitor, a second conductive pattern disposed on the first capacitor, a third conductive pattern disposed on the second conductive pattern such that the third conductive pattern and the second conductive pattern constitute a second capacitor, and a light emitting structure disposed on the second capacitor.

19 Claims, 13 Drawing Sheets

DISPLAY DEVICE

This application claims priority to Korean Patent Application No. 10-2020-0170635, filed on Dec. 8, 2020, and all the benefits accruing therefrom under 35 U.S.C. § 119, the content of which in its entirety is herein incorporated by reference.

BACKGROUND

1. Field

Embodiments relate generally to a display device. More particularly, embodiments relate a display device including transistors and capacitors.

2. Description of the Related Art

An importance of a display device has been increased with a development of multimedia. Various types of the display device such as a liquid crystal display ("LCD"), an organic light emitting display ("OLED"), etc., are being used.

The display device may include a plurality of pixels including a light emitting diode that is a self-luminous element, and each of the plurality of pixels may include a plurality of transistors and at least one capacitor for driving the light emitting diode. The plurality of transistors may include a switching transistor and a driving transistor.

SUMMARY

Embodiments provide a display device including a pixel circuit including an auxiliary capacitor and a storage capacitor.

Embodiments provide a display device including a scan driver and an emission driver that include two boost capacitors.

A display device in an embodiment may include a substrate, a first transistor disposed on the substrate and including a first gate electrode, a first conductive pattern disposed on the first gate electrode such that the first conductive pattern and the first gate electrode constitute a first capacitor, a second conductive pattern disposed on the first capacitor, a third conductive pattern disposed on the second conductive pattern such that the third conductive pattern and the second conductive pattern constitute a second capacitor, and a light emitting structure disposed on the second capacitor.

In an embodiment, the display device may further include a first insulating layer disposed between the first gate electrode and the first conductive pattern, and a second insulating layer disposed between the second conductive pattern and the third conductive pattern.

In an embodiment, a permittivity of the first insulating layer and a permittivity of the second insulating layer may be different from each other.

In an embodiment, a thickness of the first insulating layer and a thickness of the second insulating layer may be different from each other.

In an embodiment, the first transistor may further include a first active layer, a first gate insulating layer disposed between the first active layer and the first gate electrode, and a first electrode disposed on the first gate insulating layer and connected to the first active layer through a contact hole defined in the first gate insulating layer. The second conductive pattern may be electrically connected to the first electrode.

In an embodiment, the display device may further include a second transistor disposed on the first transistor.

In an embodiment, the second transistor may further include a first active layer, a first gate insulating layer disposed on the first active layer, a second gate electrode disposed on the first gate insulating layer, and a first electrode disposed on the second gate electrode and connected to a first portion of the first active layer through a first contact hole defined in the first gate insulating layer. The third conductive pattern may be electrically connected to the first electrode.

In an embodiment, the display device may further include a data line disposed in a same layer as the first electrode. The data line may be connected to a second portion of the first active layer through a second contact hole defined in the first gate insulating layer.

In an embodiment, the display device may further include a power line disposed in a same layer as the first electrode. The power line may be connected to the first conductive pattern through a second contact hole defined in the first gate insulating layer.

In an embodiment, the light emitting structure may include a lower electrode, an emission layer disposed on the lower electrode, and an upper electrode disposed on the emission layer.

In an embodiment, the display device may further include a via layer disposed on the second electrode. The lower electrode is electrically connected to the first electrode of the second transistor through a contact hole defined in the via layer.

A display device in an embodiment may include a substrate including a display area and a peripheral area surrounding the display area, a first buffer transistor disposed in the peripheral area on the substrate and including a first gate electrode, a first conductive pattern disposed on the first gate electrode such that the first conductive pattern and the first gate electrode constitute a first capacitor, a second buffer transistor disposed on the first capacitor and including a second gate electrode, a second conductive pattern disposed on the second gate electrode such that the second conductive pattern and the second gate electrode constitute a second capacitor, and a light emitting structure disposed in the display area on the substrate.

In an embodiment, the display device may further include a first insulating layer disposed between the first gate electrode and the first conductive pattern, and a second insulating layer disposed between the second gate electrode and the second conductive pattern.

In an embodiment, a permittivity of the first insulating layer and a permittivity of the second insulating layer may be different from each other.

In an embodiment, a thickness of the first insulating layer and a thickness of the second insulating layer may be different from each other.

In an embodiment, the first buffer transistor may further include a first active layer, and a first gate insulating layer disposed between the first active layer and the first gate electrode.

In an embodiment, the second buffer transistor may further include a first active layer, a first gate insulating layer disposed on the first active layer, a first electrode disposed on the second conductive pattern and connected to the first active layer though a first contact hole defined in the first gate insulating layer. The second conductive pattern may be electrically connected to the first electrode.

In an embodiment, the display device may further include a second electrode disposed in a same layer as the first electrode. The first buffer transistor may further include a second active layer. The second electrode may be connected to the second active layer through a second contact hole defined in the first gate insulating layer.

In an embodiment, the light emitting structure may include a lower electrode, an emission layer disposed on the lower electrode, and an upper electrode disposed on the emission layer.

A display device in an embodiment of the invention may include two capacitors and the two capacitors may be disposed up and down. Accordingly, an area of an auxiliary capacitor may be minimized and the display device may be applied to a high-speed driving product.

In a display device in an embodiment of the invention, each of a scan driver and an emission driver may include two boost capacitors and the two boost capacitors may be disposed up and down. Accordingly, a dead space of the display device may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
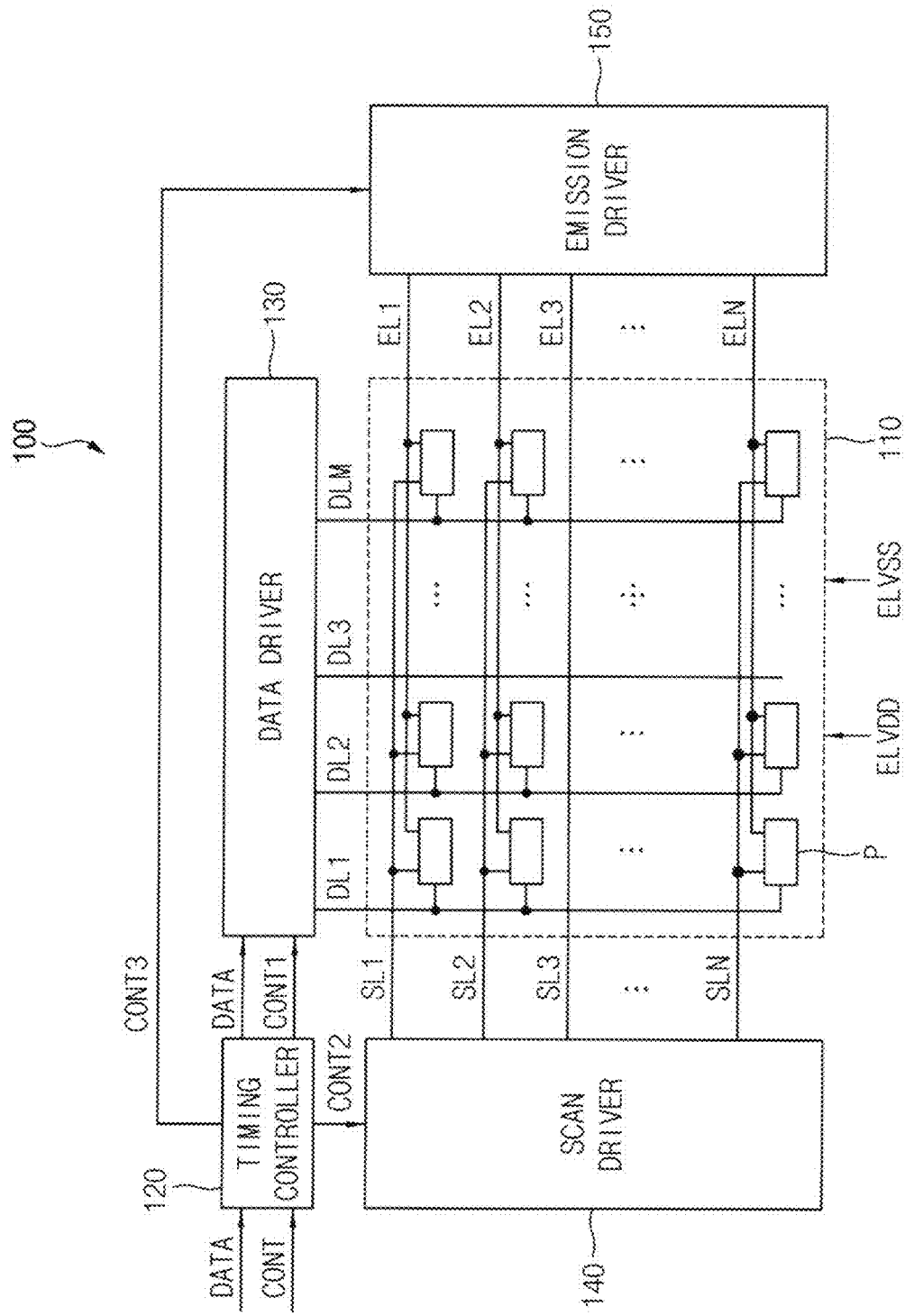
FIG. 1 is a block diagram illustrating an embodiment of a display device.

Hereinafter, embodiments of the invention will be explained in detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a block diagram illustrating an embodiment of a display device.

Referring to FIG. 1, the display device 100 may include a display portion 110, a timing controller 120, a data driver 130, a scan driver 140, and an emission driver 150.

The display portion 110 may include a plurality of pixels P The plurality of pixels P may be connected to a plurality of scan lines SL1, . . . , SLN, a plurality of data lines DL1, . . . , DLM, and a plurality of emission control lines EL1, . . . , ELN (where N and M are natural numbers greater than 1).

The data lines DL1, . . . , DLM may be connected to the data driver 130 and transmit a data voltage to the pixels PX. The scan lines SL1, . . . , SLN may be connected to the scan driver 140 and transmit a scan signal to the pixels P. The emission control lines EL1, . . . , ELN may be connected to the emission driver 150 and transmit emission control signals to the pixels P.

The pixels P may receive a driving voltage ELVDD and a common voltage ELVSS. The pixels P may receive the data voltage in response to the scan signal, and may generate light of a gray scale corresponding to the data voltage using the driving voltage ELVDD and the common voltage ELVSS.

The data driver 130 may convert a data signal DATA into a data voltage in response to a first control signal CONT1 and may output the data voltage to the data lines DL1, . . . , and DLM.

The scan driver 140 may generate a plurality of scan signals in response to a second control signal CONT2.

The emission driver 150 may generate a plurality of light emission control signals in response to a third control signal CONT3.

The timing controller 120 may receive the data signal DATA and the control signal CONT from an external device. In an embodiment, the data signal DATA may include red, green, and blue image data. The control signal CONT may include a horizontal synchronization signal, a vertical synchronization signal, and a main clock signal, etc.

The timing controller 120 may generate the first control signal CONT1 for driving the data driver 130, the second control signal CONT2 for driving the scan driver 140, and the third control signal CONT3 for driving the emission driver 150 based on the control signal CONT.

Figure 2:
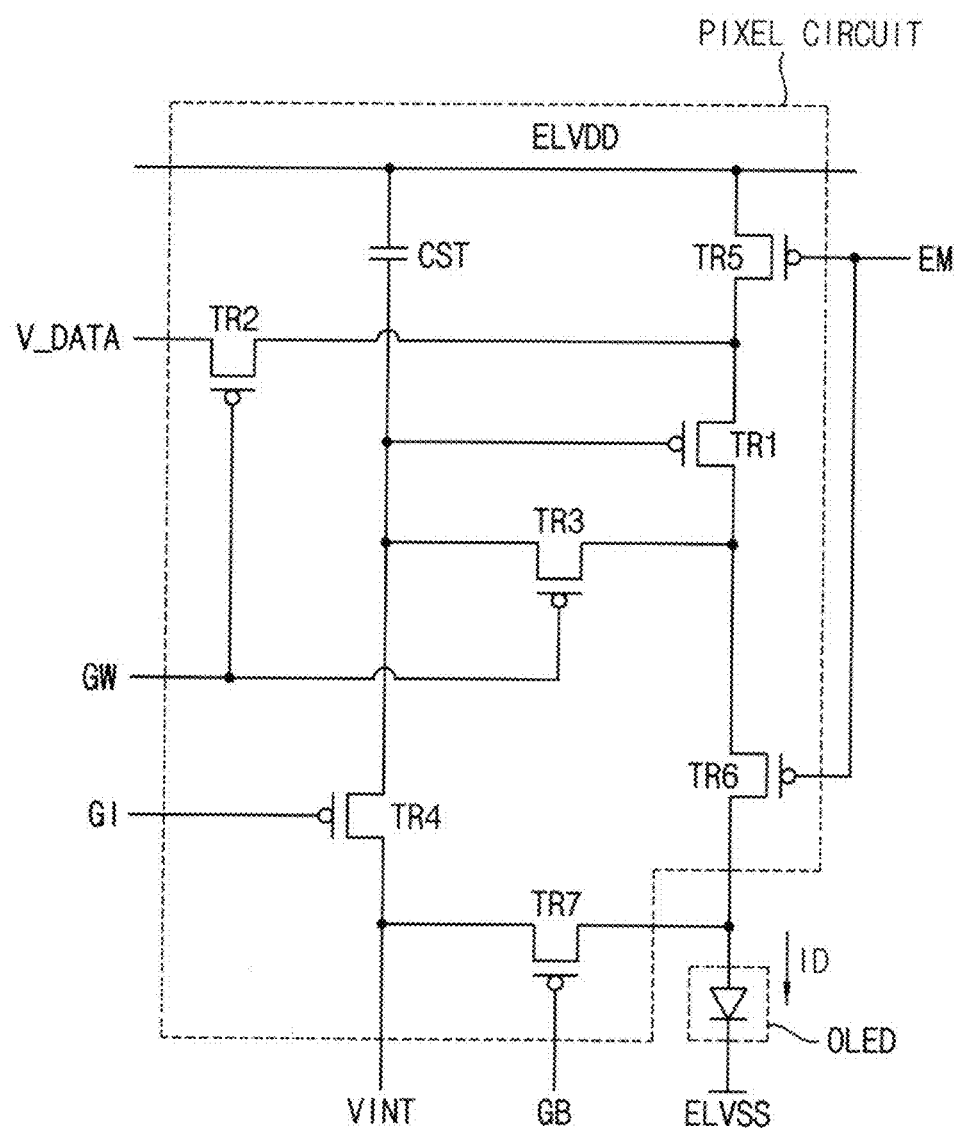
FIG. 2 is a circuit diagram illustrating a pixel circuit disposed in a conventional display portion.

FIG. 2 is a circuit diagram illustrating a pixel circuit disposed in a conventional display portion.

Referring to FIGS. 1 and 2, each of the pixels P may include a pixel circuit PIXEL CIRCUIT and an organic light emitting diode OLED. The pixel circuit PIXEL CIRCUIT may include first to seventh transistors TR1 to TR7, a storage capacitor CST, a high power voltage line to which the driving voltage ELVDD is applied, a low power voltage line to which the common voltage ELVSS is applied, a scan signal line to which a scan signal GW is applied, a data voltage line to which the data voltage V_DATA is applied, an initialization voltage line to which an initialization voltage VINT is applied, a diode initialization signal line to which a diode initialization signal GB is applied, a gate initialization signal line to which a gate initialization signal GI is applied, and an emission control signal line to which an emission control signal EM is applied.

Figure 3:
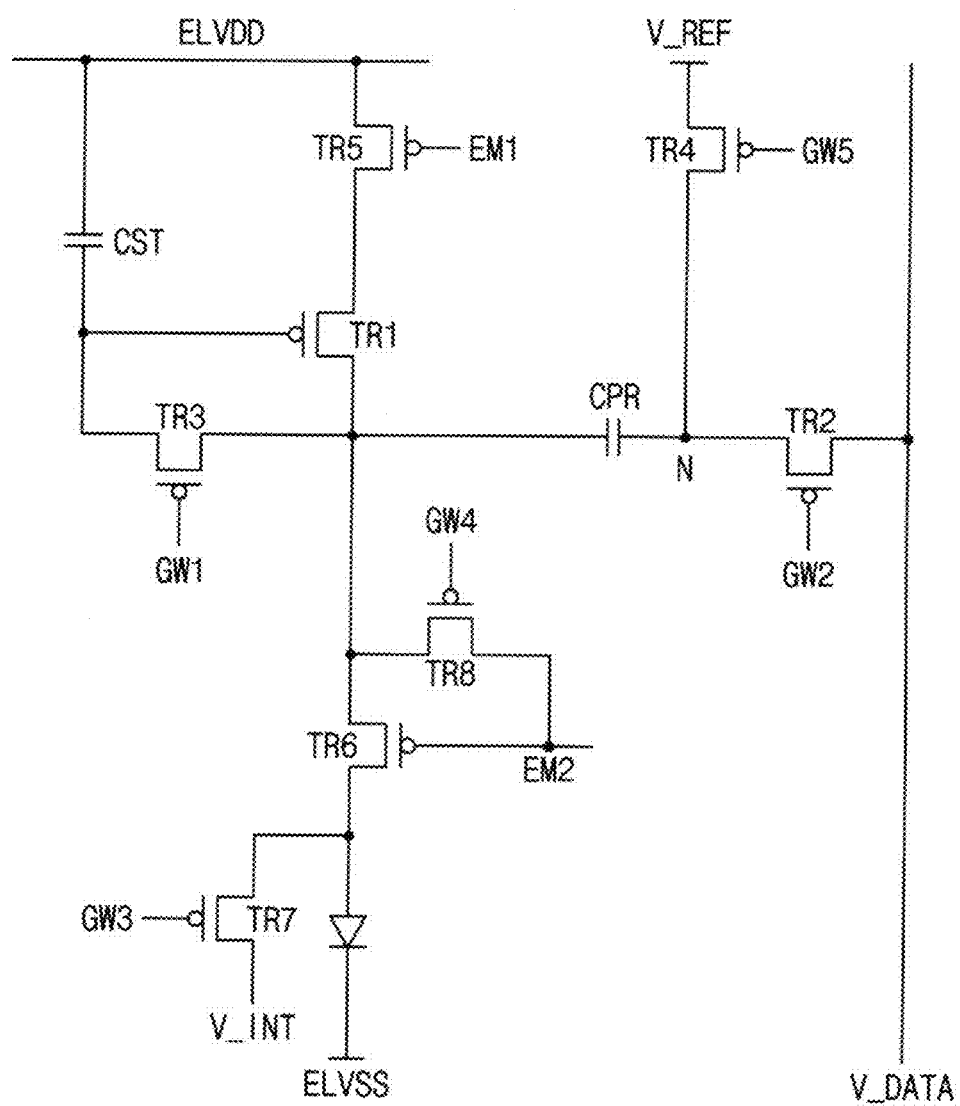
FIG. 3 is a circuit diagram illustrating a pixel circuit disposed in a display portion of FIG. 1.

FIG. 3 is a circuit diagram illustrating a pixel circuit disposed in a display portion of FIG. 1.

Redundant descriptions of components that are substantially the same as or similar to those described with reference to FIG. 2 will be omitted.

Referring to FIGS. 1 and 3, each of the pixels P included in the display device 100 may include a pixel circuit PIXEL CIRCUIT and an organic light emitting diode OLED. At least one of pixel circuits PIXEL CIRCUIT may include first to eighth transistors TR1, . . . , TR8, a storage capacitor CST, an auxiliary capacitor CPR, a high power voltage line to which the driving voltage (also referred to as a high power voltage) ELVDD is applied, a low power voltage line to which the common voltage (also referred to as a low power voltage) ELVSS is applied, an initialization voltage line to which an initialization voltage VINT is applied, a data voltage line to which the data voltage V_DATA is applied, first to fifth scan signal lines to which scan signals GW1, . . . , GW5 are respectively applied, first and second emission control signal lines to which first and second emission control signals EM1 and EM2 are respectively applied.

The organic light emitting diode OLED may output light based on a driving current ID. The organic light emitting diode OLED may include a first terminal and a second terminal. In an embodiment, the second terminal of the organic light emitting diode OLED may receive the low power voltage ELVSS. In an embodiment, the first terminal of the organic light emitting diode OLED may be an anode terminal, and the second terminal of the organic light emitting diode OLED may be a cathode terminal, for example. In an alternative embodiment, the first terminal of the organic light emitting diode OLED may be a cathode terminal, and the second terminal of the organic light emitting diode OLED may be an anode terminal.

The first transistor TR1 may include a gate terminal, a first terminal, and a second terminal. In an embodiment, the first terminal of the first transistor TR1 may be a source terminal, and the second terminal of the first transistor TR1 may be a drain terminal. In an alternative embodiment, the first terminal of the first transistor TR1 may be a drain terminal, and the second terminal of the first transistor TR1 may be a source terminal. The same may be applied to the second to eight transistors TR2 to TR8 to be described below. Therefore, a description related to this will be omitted below.

The first transistor TR1 may generate the driving current ID. In an embodiment, the first transistor TR1 may be defined as a driving transistor for driving a pixel. The first transistor TR1 may generate the driving current ID based on a voltage difference between the gate terminal and the source terminal. In addition, gray level may be expressed in the pixels P based on a magnitude of the driving current ID supplied to the organic light emitting diode OLED.

The second transistor TR2 may include a gate terminal, a first terminal, and a second terminal. The gate terminal of the second transistor TR2 may receive the second scan signal GW2. The first terminal of the second transistor TR2 may receive the data voltage V_DATA. The second terminal of the second transistor TR2 may be connected to the first terminal of the first transistor TR1. The second transistor TR2 may be defined as a switching transistor.

The second transistor TR2 may supply the data voltage V_DATA to the first terminal of the first transistor TR1 during an activation period of the second scan signal GW2.

The third transistor TR3 may include a gate terminal, a first terminal, and a second terminal. The gate terminal of the third transistor TR3 may receive the first scan signal GW1. The second terminal of the third transistor TR3 may be connected to the gate terminal of the first transistor TR1. The first terminal of the third transistor TR3 may be connected to the first terminal of the first transistor TR1.

The fourth transistor TR4 may include a gate terminal, a first terminal, and a second terminal. The gate terminal of the fourth transistor TR4 may receive the fifth scan signal GW5. The second terminal of the fourth transistor TR4 may receive the reference voltage V_REF.

The fifth transistor TR5 may include a gate terminal, a first terminal, and a second terminal. The fifth transistor TR5 may supply the high power voltage ELVDD to the second terminal of the first transistor TR1 during an activation period of the first emission control signal EM1. Conversely, the fifth transistor TR5 may block a supply of the high power voltage ELVDD during an inactive period of the first emission control signal EM1.

The sixth transistor TR6 may include a gate terminal, a first terminal, and a second terminal. The gate terminal of the sixth transistor TR6 may receive the second emission control signal EM2. The second terminal of the sixth transistor TR6 may be connected to the first terminal of the first transistor TR1. The first terminal of the sixth transistor TR6 may be connected to the first terminal of the organic light emitting diode OLED.

The sixth transistor TR6 may supply the driving current ID generated by the first transistor TR1 to the organic light emitting diode OLED during an activation period of the second emission control signal EM2.

The seventh transistor TR7 may include a gate terminal, a first terminal, and a second terminal. The gate terminal of the seventh transistor TR7 may receive the third scan signal GW3. The first terminal of the seventh transistor TR7 may receive the initialization voltage V_INT. The second terminal of the seventh transistor TR7 may be connected to the first terminal of the organic light emitting diode OLED.

The seventh transistor TR7 may supply the initialization voltage V_INT to the first terminal of the organic light emitting diode OLED during an activation period of the third scan signal GW3. The seventh transistor TR7 may initialize the first terminal of the organic light emitting diode OLED to the initialization voltage V_INT during the activation period of the third scan signal GW3.

The eighth transistor TR8 may include a gate terminal, a first terminal, and a second terminal. The gate terminal of the eighth transistor TR8 may receive the fourth scan signal GW5. The first terminal of the eighth transistor TR8 may be connected to the first terminal of the first transistor TR1. The second terminal of the eighth transistor TR8 may be connected to the gate terminal of the sixth transistor TR6.

The storage capacitor CST may include a first terminal and a second terminal. The storage capacitor CST may be connected between the high power voltage line to which the high power voltage ELVDD is applied and the gate terminal of the first transistor TR1.

The auxiliary capacitor CPR may include a first terminal and a second terminal. The auxiliary capacitor CPR may be connected between the first terminal of the first transistor TR1 and the second terminal of the second transistor TR2. In an embodiment, the auxiliary capacitor CPR, the second transistor TR2 and the fourth transistor TR4 may be connected to a node N.

Figure 4:
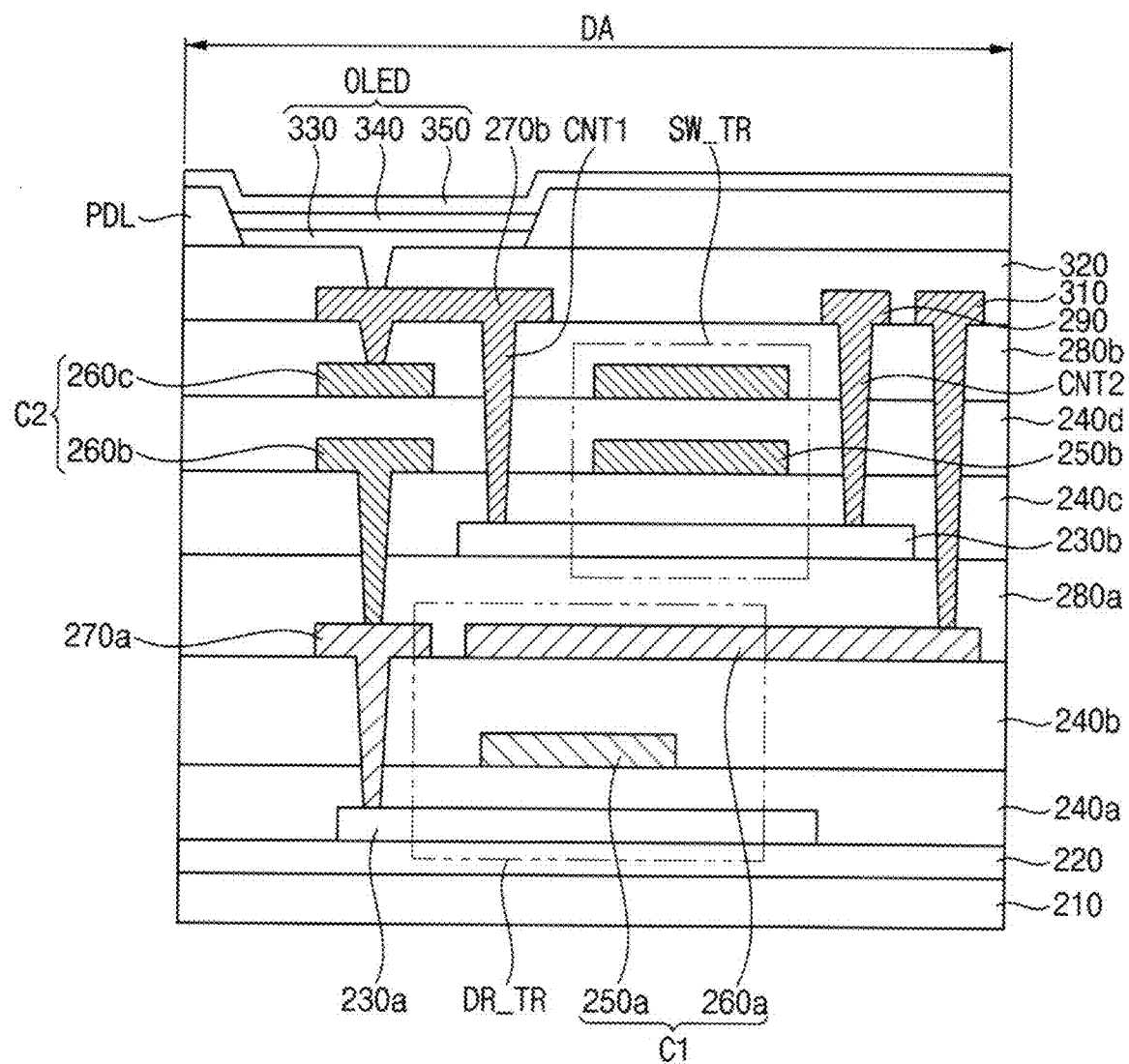
FIG. 4 is a cross-sectional view illustrating a transistor and a capacitor that are included in the pixel circuit of FIG. 3.

FIG. 4 is a cross-sectional view illustrating a transistor and a capacitor that are included in the pixel circuit of FIG. 3.

Referring to FIGS. 1 and 4, the display device 100 may include a substrate 210, a buffer layer 220, a first conductive pattern 260a, a second conductive pattern 260b, a third conductive pattern 260c, a first inter-insulating layer 280a, a second inter-insulating layer 280b, a via layer 320, a driving transistor DR_TR, a switching transistor SW_TR, a first capacitor C1, a second capacitor C2, a first Insulating layer 240b, a second insulating layer 240d, a first electrode 270a, a second electrode 270b, a data line 290, a power line 310, a pixel defining layer PDL, the organic light emitting diode OLED, and the like.

The driving transistor DR_TR may include a first active layer 230a, a first gate electrode 250a, and a first gate insulating layer 240a. In an embodiment, the driving transistor DR_TR may correspond to the first transistor TR1 of FIG. 3.

The switching transistor SW_TR may include a second active layer 230b, a second gate electrode 250b, and a second gate insulating layer 240c. In an embodiment, the switching transistor SW_TR may correspond to the second transistor TR2 of FIG. 3.

The organic light emitting diode OLED may include a lower electrode 330, an intermediate layer 340, and an upper electrode 350.

The substrate 210 may include a display area DA in which an image is displayed. The display portion 110 may be disposed in the display area DA. The substrate 210 may include a transparent or opaque material. In an embodiment, the substrate 210 may include a quartz substrate, a synthetic quartz substrate, a calcium fluoride substrate, a soda lime glass substrate, an alkali-free glass substrate, and the like, for example. In an alternative embodiment, the substrate 210 may include a flexible transparent resin substrate.

The buffer layer 220 may be disposed on the substrate 210. The buffer layer 220 may prevent diffusion of metal atoms or impurities from the substrate 210 to the driving transistor DR_TR and the switching transistor SW_TR.

The first active layer 230a may be disposed on the buffer layer 220. In an embodiment, the first active layer 230a may include an inorganic semiconductor (e.g., polysilicon, etc.). In an embodiment, the first active layer 230a may have a channel region, a first region, and a second region.

The first gate insulating layer 240a may be disposed on the buffer layer 220. The first gate insulating layer 240a may cover the first active layer 230a. In an embodiment, the first gate insulating layer 240a may be a single layer including silicon oxide (SiOx).

The first gate electrode 250a may be disposed on the first gate insulating layer 240a. The first gate electrode 250a may overlap the first active layer 230a. The first gate electrode 250a may include a metal, an alloy, a metal nitride, a conductive metal oxide, a transparent conductive material, and the like.

The first insulating layer 240b may be disposed on the first gate insulating layer 240a. The first insulating layer 240b may cover the first gate electrode 250a. In an embodiment, the first insulating layer 240b may be a single layer including silicon nitride (SiNx).

A first conductive pattern 260a and the first electrode 270a may be disposed on the first insulating layer 240b. The first conductive pattern 260a may overlap the first gate electrode 250a. Each of the first conductive pattern 260a and the first electrode 270a may include a metal, an alloy, a metal nitride, a conductive metal oxide, a transparent conductive material, and the like.

The second conductive pattern 260b may be electrically connected to the first region of the first active layer 230a through a contact hole.

The first capacitor C1 may include a first conductive pattern 260a and may be constituted of the first gate electrode 250a and the first conductive pattern 260a. The first capacitor C1 may correspond to the storage capacitor CST shown in FIG. 3.

The first inter-insulating layer 280a may be disposed on the first insulating layer 240b. The first inter-insulating layer 280a may cover the first conductive pattern 260a and the first electrode 270a. The first inter-insulating layer 280a may include a silicon compound, a metal oxide, and the like.

The second active layer 230b may be disposed on the first inter-insulating layer 280a. In an embodiment, the second active layer 230b may include an inorganic semiconductor (e.g., polysilicon, etc.). In an embodiment, the second active layer 230b may have a channel region, a first region, and a second region.

The second gate insulating layer 240c may be disposed on the first inter-insulating layer 280a. The second gate insulating layer 240c may cover the second active layer 230b. In an embodiment, the second gate insulating layer 240c may be a single layer including silicon oxide (SiOx).

The second gate electrode 250b may be disposed on the second gate insulating layer 240c. The second gate electrode 250b may overlap the second active layer 230b. The second gate electrode 250b may include a metal, an alloy, a metal nitride, a conductive metal oxide, a transparent conductive material, and the like.

The second conductive pattern 260b may be disposed on the second gate insulating layer 240c. The second conductive pattern 260b may include a metal, an alloy, a metal nitride, a conductive metal oxide, a transparent conductive material, and the like. The second conductive pattern 260b may be electrically connected to the first electrode 270a through a contact hole.

The second insulating layer 240d may be disposed on the second gate insulating layer 240c. The second insulating layer 240d may cover the second gate electrode 250b and the second conductive pattern 260b. In an embodiment, the second insulating layer 240d may be a single layer including silicon nitride (SiNx).

In an embodiment, a permittivity of the first insulating layer 240b and a permittivity of the second insulating layer 240d may be different. In an embodiment, the permittivity of the first insulating layer 240b may be higher than the permittivity of the second insulating layer 240d, for example. In an alternative embodiment, the permittivity of the first insulating layer 240b may be lower than the permittivity of the second insulating layer 240d. Accordingly, by minimizing an area of the second capacitor C2, the display device 100 may be applied to a high-speed driving product.

In an embodiment, a thickness of the first insulating layer 240b and a thickness of the second insulating layer 240d may be different. In an embodiment, the thickness of the first insulating layer 240b may be greater than the thickness of the second insulating layer 240d, for example. In an alternative embodiment, the thickness of the first insulating layer 240b may be smaller than the thickness of the second insulating layer 240d. Accordingly, by minimizing the area of the second capacitor C2, the display device 100 may be applied to a high-speed driving product.

The third conductive pattern 260c may be disposed on the second insulating layer 240d. The third conductive pattern 260c may overlap the second conductive pattern 260b. The third conductive pattern 260c may include a metal, an alloy, a metal nitride, a conductive metal oxide, a transparent conductive material, and the like.

The second capacitor C2 may include the third conductive pattern 260c and may be constituted of the second conductive pattern 260b and the third conductive pattern 260c. The second capacitor C2 may correspond to the auxiliary capacitor CPR shown in FIG. 3.

The second inter-insulating layer 280b may be disposed on the second insulating layer 240d. The second inter-insulating layer 280b may cover the third conductive pattern 260c. The second inter-insulating layer 280b may include a silicon compound, a metal oxide, and the like.

The second electrode 270b, the data line 290, and the power line 310 may be disposed on the second inter-insulating layer 280b. The second electrode 270b may be electrically connected to the third conductive pattern 260c through a contact hole, and may be connected to the first region of the second active layer 230b through the first contact hole CNT1. The data line 290 may be connected to the second region of the second active layer 230b through the second contact hole CNT2. The power line 310 may be electrically connected to the first conductive pattern 260a through a contact hole. Each of the second electrode 270b, the data line 290 and the power line 310 may include a metal, an alloy, a metal nitride, a conductive metal oxide, a transparent conductive material, and the like.

The via layer 320 may be disposed on the second inter-insulating layer 280b. The via layer 320 may cover the second electrode 270b, the data line 290, and the power line 310.

The lower electrode 330 may be disposed on the via layer 320. The lower electrode 330 may be electrically connected to the second electrode 270b through a contact hole. In an embodiment, the lower electrode 330 may be an anode electrode. In an alternative embodiment, the lower electrode 330 may be a cathode electrode. The lower electrode 330 may include a metal, an alloy, a metal nitride, a conductive metal oxide, a transparent conductive material, and the like.

The pixel defining layer PDL may be disposed on the via layer 320. An opening exposing an upper surface of the lower electrode 330 may be defined in the pixel defining layer PDL. The pixel defining layer PDL may include an organic material or an inorganic material.

The intermediate layer 340 may be disposed on the lower electrode 330 exposed by the pixel defining layer PDL. The intermediate layer 340 may include at least one selected from a hole injection layer, a hole transport layer, an emission layer, an electron transport layer, and an electron injection layer.

The upper electrode 350 may be disposed on the intermediate layer 340 and the pixel defining layer PDL. The upper electrode 350 may be entirely disposed on the substrate 210. The upper electrode 350 may cover the intermediate layer 340 and the pixel defining layer PDL. In an embodiment, the upper electrode 350 may be a cathode electrode. In an alternative embodiment, the upper electrode 350 may be an anode electrode. The upper electrode 350 may include a metal, an alloy, a metal nitride, a conductive metal oxide, a transparent conductive material, and the like.

Figure 5:
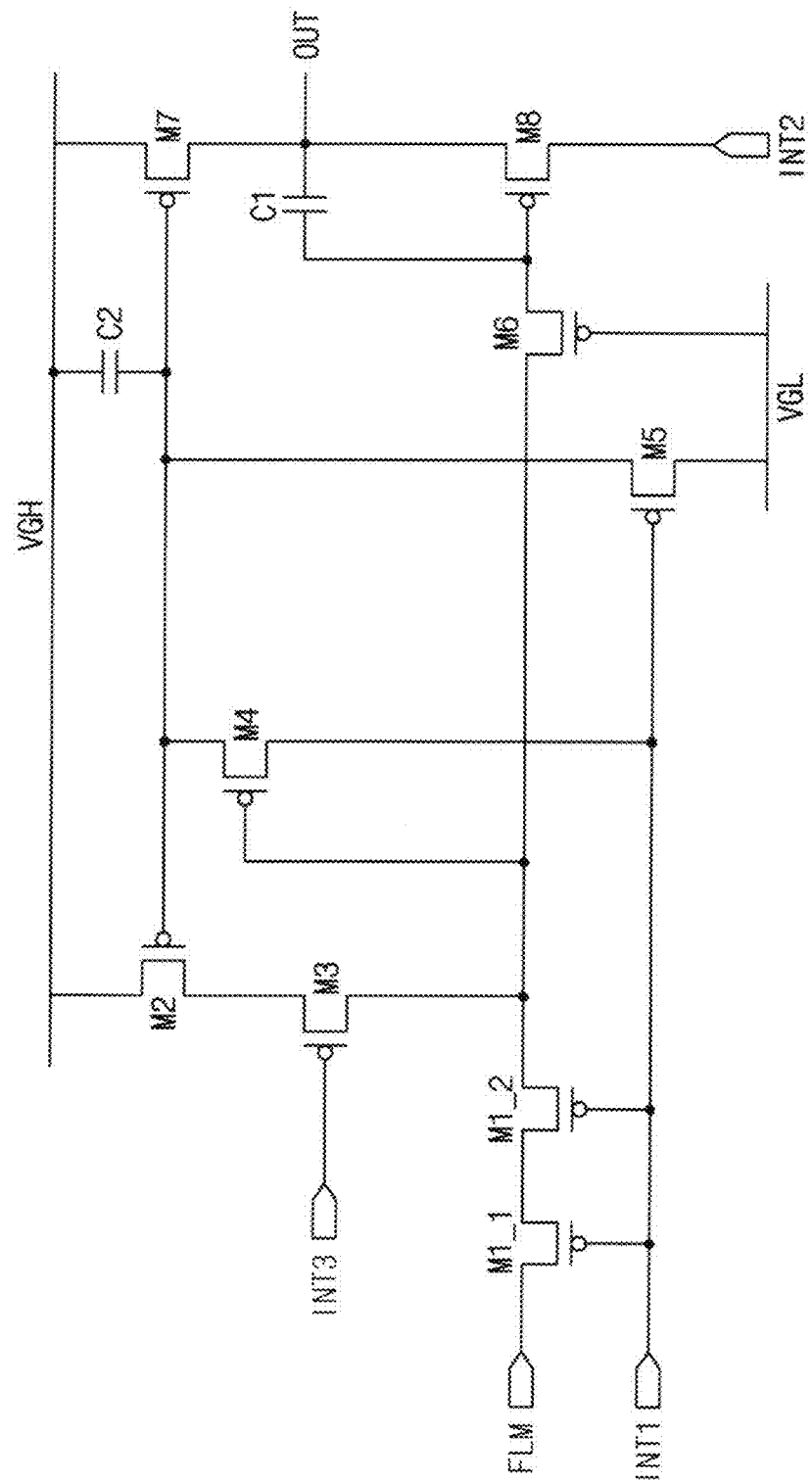
FIG. 5 is a circuit diagram illustrating a scan circuit disposed in a scan driver of FIG. 1.

FIG. 5 is a circuit diagram illustrating a scan circuit disposed in a scan driver of FIG. 1.

Referring to FIGS. 1 and 5, the scan driver 140 may include a plurality of stages, and each of the stages may include a scan circuit.

The scan circuit may include a plurality of transistors M1-1, M1-2, M2, M3, M4, M5, M6, M7, and M8 and a plurality of capacitors C1 and C2. A plurality of signals FLM, INT1, INT2, INT3, VGH, and VGL may be applied to the scan circuit. The scan circuit may output a scan control signal OUT in response to the signals.

In an embodiment, the transistors M7 and M8 connected to the scan control signal output portion which outputs the scan control signal OUT may be defined as a first buffer transistor and a second buffer transistor, respectively. The transistors M1-1, M1-2, M2, M3, M4, M5, and M6 other than the first buffer transistor and the second buffer transistor may be defined as scan circuit transistors, respectively.

Figure 6:
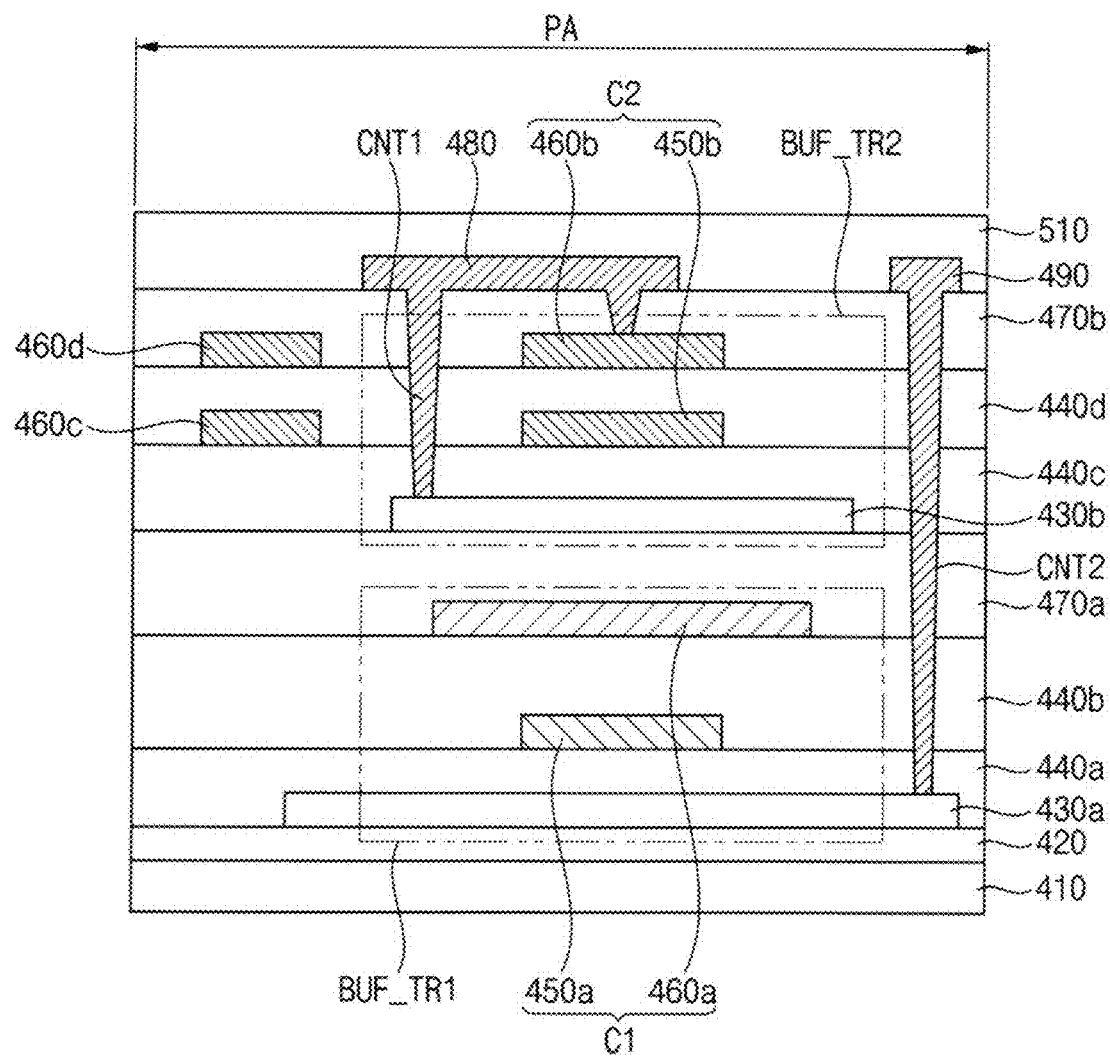
FIG. 6 is a cross-sectional view illustrating a transistor and a capacitor that are included in the scan circuit of FIG. 5.

FIG. 6 is a cross-sectional view illustrating a transistor and a capacitor that are included in the scan circuit of FIG. 5.

Referring to FIGS. 1 and 6, the scan driver 140 may include a substrate 410, a buffer layer 420, a via layer 510, a first gate insulating layer 440a, a second gate insulating layer 440c, a first inter-insulating layer 470a, a second inter-insulating layer 470b, a first insulating layer 440b, a second insulating layer 440d, a first gate electrode 450a, a second gate electrode 450b, first to fourth conductive patterns 460a, 460b, 460c, and 460d, a first electrode 480, a second electrode 490, the first capacitor C1, the second capacitor C2, the first buffer transistor BUF_TR1, the second buffer transistor BUF_TR2, and the like.

In an embodiment, the first buffer transistor BUF_TR1 and the second buffer transistor BUF_TR2 may be defined as transistors M7 and M8 of FIG. 5, respectively.

The first buffer transistor BUF_TR1 may include a first active layer 430a, a first gate insulating layer 440a, and a first gate electrode 450a. The second buffer transistor BUF_TR2 may include a second active layer 430b, a second gate insulating layer 440c, and a second gate electrode 450b.

In an embodiment, each of the first gate insulating layer 440a and the second gate insulating layer 440c may include silicon oxide (SiOx). In an embodiment, each of the first insulating layer 440b and the second insulating layer 440d may include silicon nitride (SiNx).

In an embodiment, a permittivity of the first insulating layer 440b and a permittivity of the second insulating layer 440d may be different. In an embodiment, the permittivity of the first insulating layer 440b may be greater than the permittivity of the second insulating layer 440d, for example. In an alternative embodiment, the permittivity of the first insulating layer 440b may be smaller than the permittivity of the second insulating layer 440d.

In an embodiment, a thickness of the first insulating layer 440b and a thickness of the second insulating layer 440d may be different. In an embodiment, the thickness of the first insulating layer 440b may be greater than the thickness of the second insulating layer 440d, for example. In an alternative embodiment, the thickness of the first insulating layer 440b may be smaller than the thickness of the second insulating layer 440d.

The substrate 410 may include a peripheral area PA in which an image is not displayed. The scan driver 140 shown in FIG. 1 may be disposed in the peripheral area PA. The first active layer 430a may be disposed on the buffer layer 420. The first gate insulating layer 440a may be disposed on the buffer layer 420 and may cover the first active layer 430a. The first gate electrode 450a may be disposed on the first gate insulating layer 440a. The first insulating layer 440b may be disposed on the first gate insulating layer 440a and may cover the first gate electrode 450a. The first conductive pattern 460a may be disposed on the first insulating layer 440b. The first conductive pattern 460a may overlap the first gate electrode 450a. The first inter-insulating layer 470a may be disposed on the first insulating layer 440b and may cover the first conductive pattern 460a.

The second active layer 430b may be disposed on the first inter-insulating layer 470a. The second gate insulating layer 440c may be disposed on the first inter-insulating layer 470a and may cover the second active layer 430b. The second gate electrode 450b and the third conductive pattern 460c may be disposed on the second gate insulating layer 440c. The second gate electrode 450b may overlap the second active layer 430b. The second insulating layer 440d may be disposed on the second gate insulating layer 440c and may cover the second gate electrode 450b and the third conductive pattern 460c. The second conductive pattern 460b and the fourth conductive pattern 460d may be disposed on the second insulating layer 440d. The second conductive pattern 460b may overlap the second gate electrode 450b. The fourth conductive pattern 460d may overlap the third conductive pattern 460c. The second inter-insulating layer 470b may be disposed on the second insulating layer 440d and may cover the second conductive pattern 460b and the fourth conductive pattern 460d.

The first electrode 480 and the second electrode 490 may be disposed on the second inter-insulating layer 470b. The via layer 510 may be disposed on the second inter-insulating layer 470b and may cover the first electrode 480 and the second electrode 490.

The first electrode 480 may be connected to the second active layer 430b through a first contact hole CNT1. The second electrode 490 may be connected to the first active layer 430a through a second contact hole CNT2.

The first capacitor C1 may include the first conductive pattern 460a and may be constituted of the first gate electrode 450a and the first conductive pattern 460a. The second capacitor C2 may include a second conductive pattern 460b, and may be constituted of the second gate electrode 450b and the second conductive pattern 460b. Each of the first capacitor C1 and the second capacitor C2 may be defined as a boost capacitor.

In an embodiment, the second capacitor C2 may be disposed on the first capacitor C1. Accordingly, a dead space of the display device 100 may be reduced.

Figure 7:
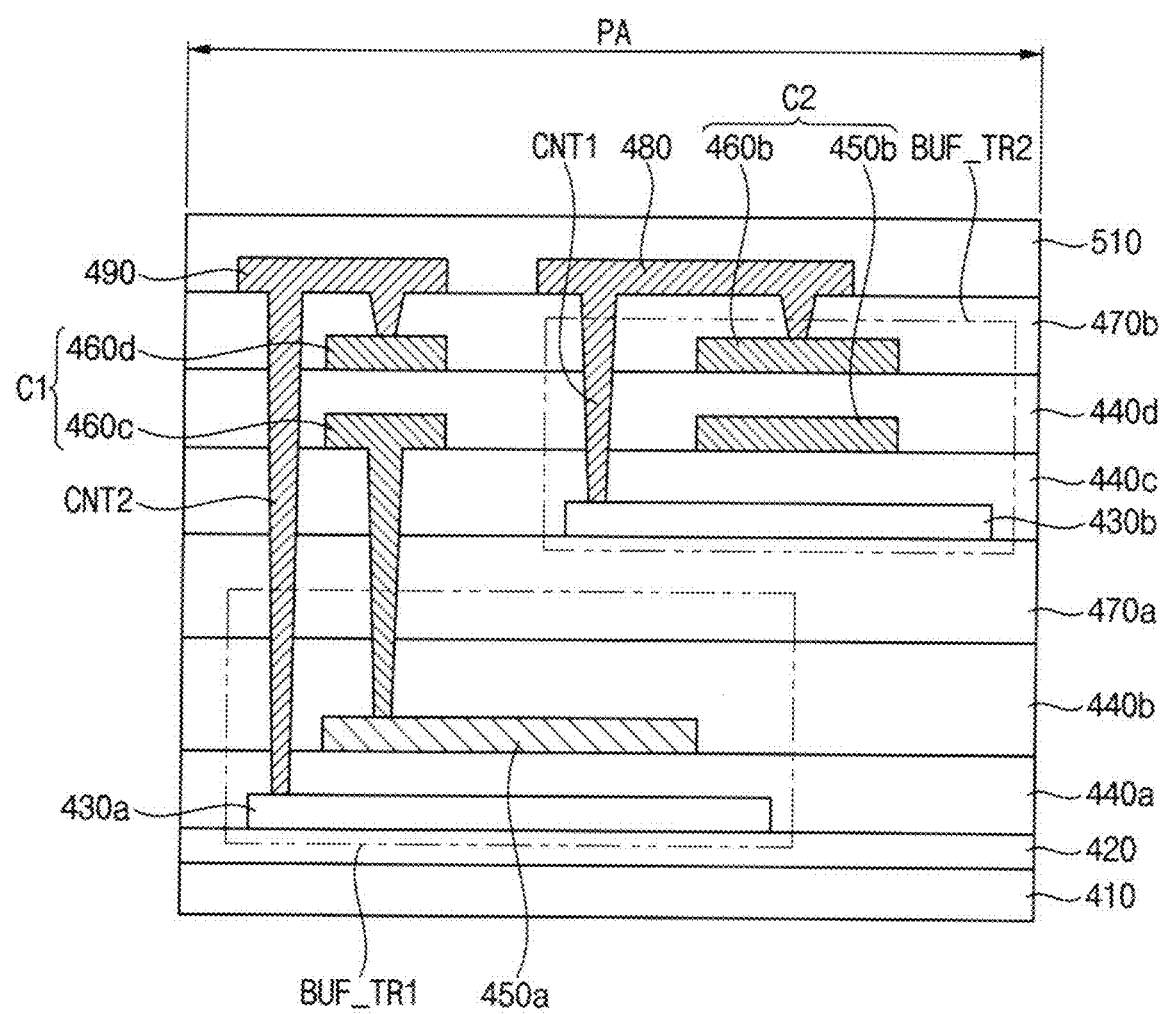
FIG. 7 is a cross-sectional view illustrating an embodiment of a transistor and a capacitor that are included in the scan circuit of FIG. 5.

FIG. 7 is a cross-sectional view illustrating an embodiment of a transistor and a capacitor that are included in the scan circuit of FIG. 5.

Redundant descriptions of components that are substantially the same as or similar to those described with reference to FIG. 6 will be omitted.

Referring to FIGS. 1 and 7, the scan driver 140 may not include the first conductive pattern 450a on the first insulating layer 440b.

The second electrode 490 may overlap the fourth conductive pattern 460d. The second electrode 490 may be electrically connected to the fourth conductive pattern 460d through a contact hole. The second electrode 490 may be connected to the first active layer 430a through a second contact hole CNT2.

The first capacitor C1 may include the fourth conductive pattern 460d, and may be constituted of the third conductive pattern 460c and the fourth conductive pattern 460d. The second capacitor C2 may include a second conductive pattern 460b and may be constituted of the second gate electrode 450b and the second conductive pattern 460b. The first capacitor C1 and the second capacitor C2 may be defined as boost capacitors.

In an embodiment, the first capacitor C1 and the second capacitor C2 may be disposed on a same layer. Accordingly, a dead space of the display device 100 may be reduced.

Figure 8:
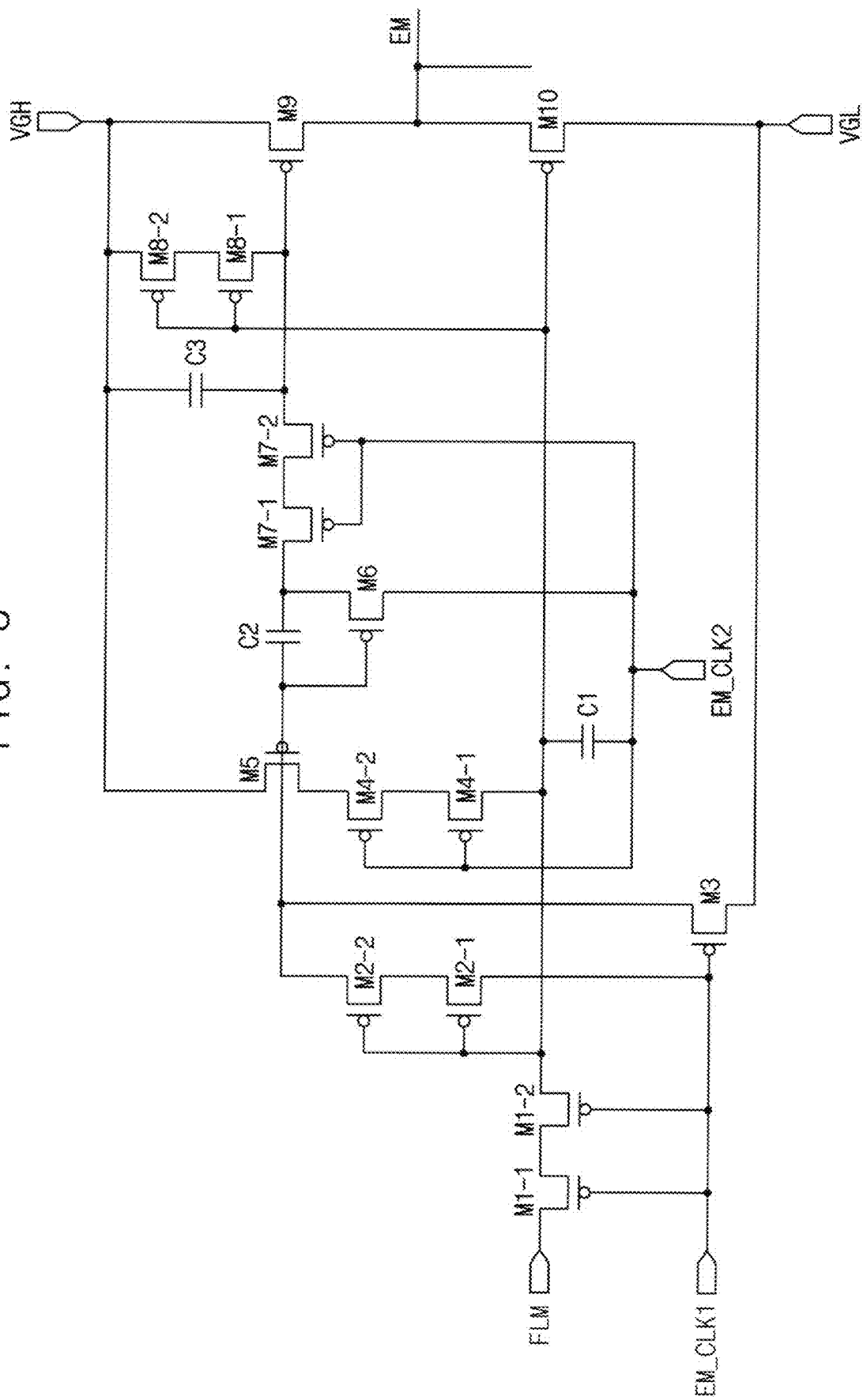
FIG. 8 is a circuit diagram illustrating a light emitting circuit disposed in an emission driver of FIG. 1.

FIG. 8 is a circuit diagram illustrating a light emitting circuit disposed in an emission driver of FIG. 1.

Referring to FIGS. 1 and 8, the emission driver of FIG. 1 may include an emission circuit. The emission circuit may include a plurality of transistors M1-1, M1-2, M2-1, M2-2, M3, M4-1, M4-2, M5, M6, M7-1, M7-2, M8-1, M8-2, M9, and M10 and a plurality of capacitors C1, C2, and C3. A plurality of signals FLM, EM_CLK1, EM_CLK2, VGL, VGH, and EM may be applied to the emission circuit. The emission circuit may output an emission control signal EM in response to the signals.

In an embodiment, the transistors M9 and M10 connected to the emission control signal output portion which outputs the emission control signal EM may be defined as a first buffer transistor and a second buffer transistor, respectively.

Transistors M1-1, M1-2, M2-1, M2-2, M3, M4-1, M4-2, M5, M6, M7-1, M7-2, M8-1, and M8-2 other than the first buffer transistor and the second buffer transistor may be defined as light emitting circuit transistors.

Figure 9:
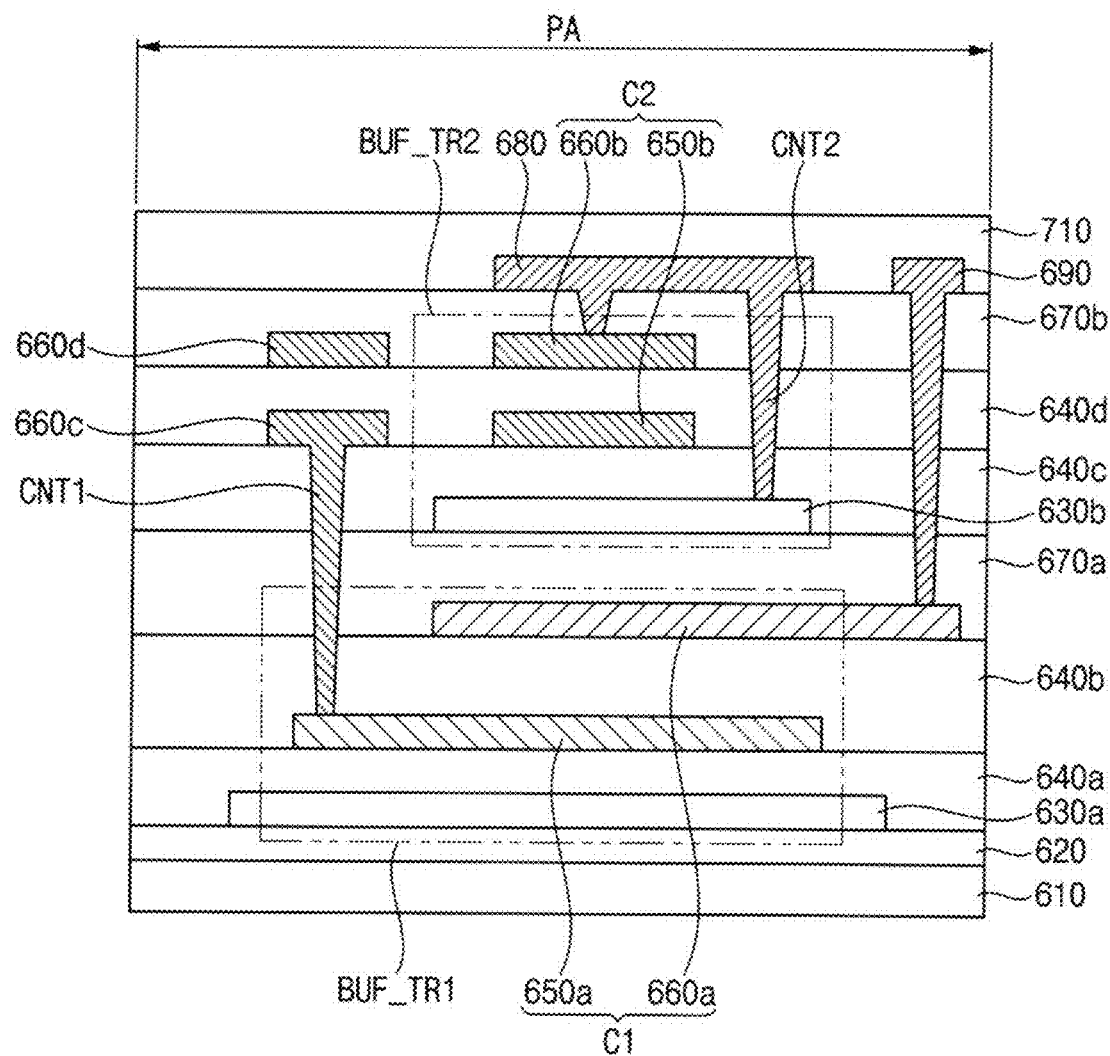
FIG. 9 is a cross-sectional view illustrating a transistor and a capacitor that are included in the light emitting circuit of FIG. 8.

FIG. 9 is a cross-sectional view illustrating a transistor and a capacitor that are included in the light emitting circuit of FIG. 8.

Referring to FIGS. 1 and 9, the emission driver 150 may include a substrate 610, a buffer layer 620, a via layer 710, a first gate insulating layer 640a, a second gate insulating layer 640c, a first inter-insulating layer 670a, a second inter-insulating layer 670b, a first insulating layer 640b, a second insulating layer 640d, a first gate electrode 650a, a second gate electrode 650b, first to fourth conductive patterns 660a, 660b, 660c, and 660d, a first capacitor C1, a second capacitor C2, a first electrode 680, a second electrode 690, a first buffer transistor BUF_TR1, a second buffer transistor BUF_TR2, and the like.

In an embodiment, the first buffer transistor BUF_TR1 and the second buffer transistor BUR_TR2 may be defined as the transistors M10 and M9 of FIG. 8, respectively.

The first buffer transistor BUF_TR1 may include a first active layer 630a, a first gate insulating layer 640a, and a first gate electrode 650a. The second buffer transistor BUF_TR2 may include a second active layer 630b, a second gate insulating layer 640c, and a second gate electrode 650b.

In an embodiment, each of the first gate insulating layer 640a and the second gate insulating layer 640c may include silicon oxide (SiOx). In an embodiment, each of the first insulating layer 640b and the second insulating layer 640d may include silicon nitride (SiNx).

In an embodiment, a permittivity of the first insulating layer 640b and a permittivity of the second insulating layer 640d may be different. In an embodiment, the permittivity of the first insulating layer 640b may be greater than the permittivity of the second insulating layer 640d, for example. In an alternative embodiment, the permittivity of the first insulating layer 640b may be smaller than the permittivity of the second insulating layer 640d.

In an embodiment, a thickness of the first insulating layer 640b and a thickness of the second insulating layer 640d may be different. In an embodiment, the thickness of the first insulating layer 640b may be greater than the thickness of the second insulating layer 640d. In an alternative embodiment, the thickness of the first insulating layer 640b may be smaller than the thickness of the second insulating layer 640d.

The substrate 610 may include a peripheral area PA in which an image is not displayed. The emission driver 150 shown in FIG. 1 may be disposed in the peripheral area PA. The buffer layer 620 may be disposed on the substrate 610. The first active layer 630a may be disposed on the buffer layer 620. The first gate insulating layer 640a may be disposed on the buffer layer 620 and may cover the first active layer 630a. The first gate electrode 650a may be disposed on the first gate insulating layer 640a. The first insulating layer 640b may be disposed on the first gate insulating layer 640a and may cover the first gate electrode 650a. The first conductive pattern 660a may be disposed on the first insulating layer 640b. The first conductive pattern 660a may overlap the first gate electrode 650a. The first inter-insulating layer 670a may be disposed on the first insulating layer 640b and may cover the first conductive pattern 660a.

The second active layer 630b may be disposed on the first inter-insulating layer 670a. The second gate insulating layer 640c may be disposed on the first inter-insulating layer 670a and may cover the second active layer 630b. The second gate electrode 650b and the third conductive pattern 660c may be disposed on the second gate insulating layer 640c. The second gate electrode 650b may overlap the second active layer 630b. The third conductive pattern 660c may be connected to the first gate electrode 650a through a first contact hole CNT1. The second insulating layer 640d may be disposed on the second gate insulating layer 640c and may cover the second gate electrode 650b and the third conductive pattern 660c. The second conductive pattern 660b and the fourth conductive pattern 660d may be disposed on the second insulating layer 640d. The second conductive pattern 660b may overlap the second gate electrode 650b and the fourth conductive pattern 660d may overlap the third conductive pattern 660c. The second inter-insulating layer 670b may be disposed on the second insulating layer 640d and may cover the second conductive pattern 660b and the fourth conductive pattern 660d. The first electrode 680 and the second electrode 690 may be disposed on the second inter-insulating layer 670b. The via layer 710 may be disposed on the second inter-insulating layer 670b and may cover the first electrode 680 and the second electrode 690.

The first electrode 680 may be electrically connected to the second conductive pattern 660b through a contact hole, and may be connected to the second active layer 630b through a second contact hole CNT2. The second electrode 690 may be electrically connected to the first conductive pattern 660a through a contact hole.

The first capacitor C1 may include the first conductive pattern 660a and may be constituted of the first gate electrode 650a and the first conductive pattern 660a. The second capacitor C2 may include the second conductive pattern 660b, and may be constituted of the second gate electrode 650b and the second conductive pattern 660b. Each of the first capacitor C1 and the second capacitor C2 may be defined as a boost capacitor.

In an embodiment, the second capacitor C2 may be disposed on the first capacitor C1. Accordingly, a dead space of the display device 100 may be reduced.

Figure 10:
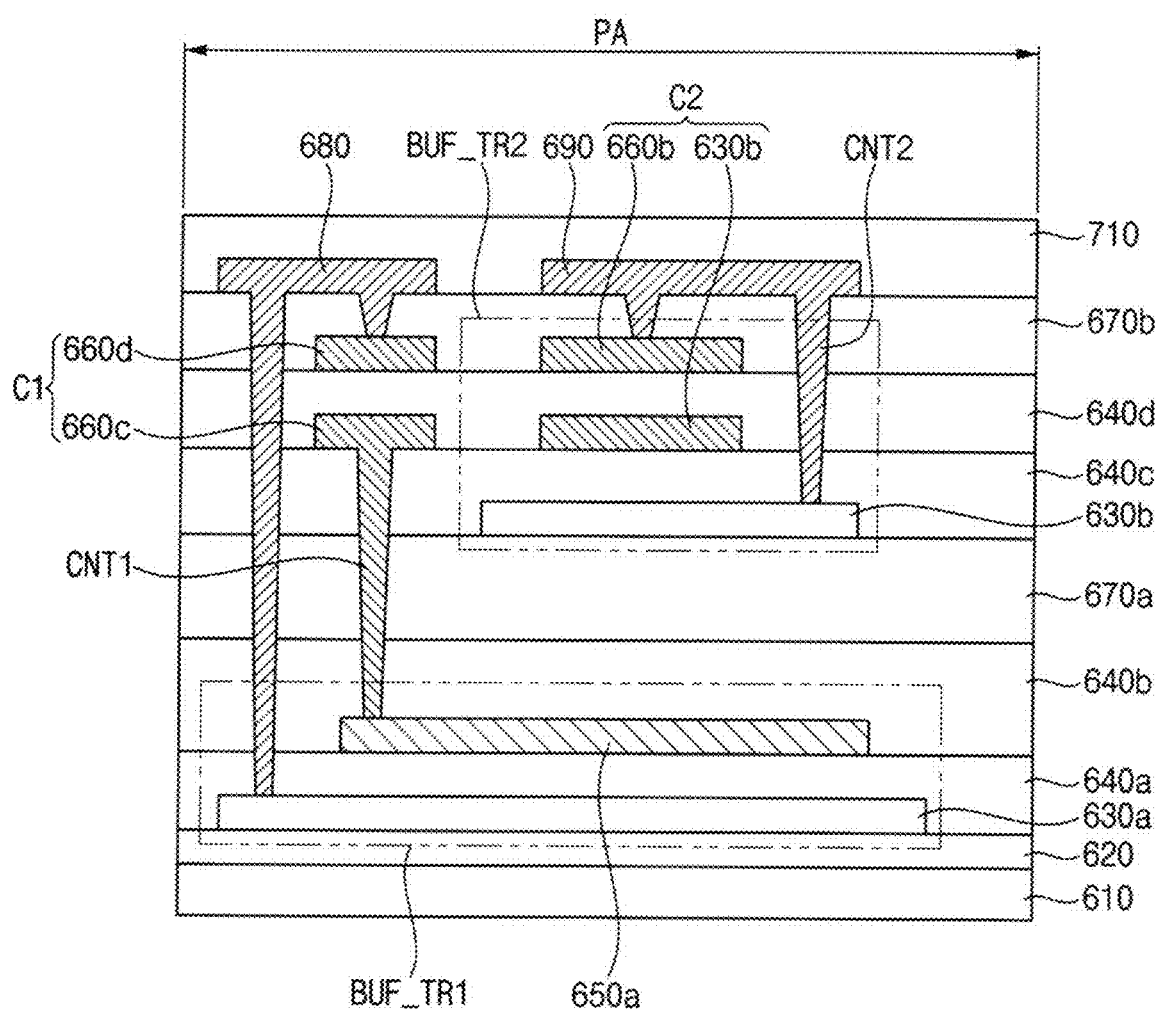
FIG. 10 is a cross-sectional view illustrating an embodiment of a transistor and a capacitor that are included in the light emitting circuit of FIG. 8.

FIG. 10 is a cross-sectional view illustrating an embodiment of a transistor and a capacitor that are included in the light emitting circuit of FIG. 8. Redundant descriptions of components that are substantially the same as or similar to those described with reference to FIG. 9 will be omitted.

Referring to FIGS. 1 and 10, the emission driver 150 may not include the first conductive pattern 660a disposed on the first insulating layer 640b.

The first capacitor C1 may include the fourth conductive pattern 660d and may be constituted of the third conductive pattern 660c and the fourth conductive pattern 660d. The second capacitor C2 may include the second conductive pattern 660b and may be constituted of the second gate electrode 650b and the second conductive pattern 660b. Each of the first capacitor C1 and the second capacitor C2 may be defined as a boost capacitor.

In an embodiment, the first capacitor C1 and the second capacitor C2 may be disposed on a same layer. Accordingly, a dead space of the display device 100 may be reduced.

FIGS. 11, 12, 13, and 14 are cross-sectional views illustrating an embodiment of a method of manufacturing a display device.

Figure 11:
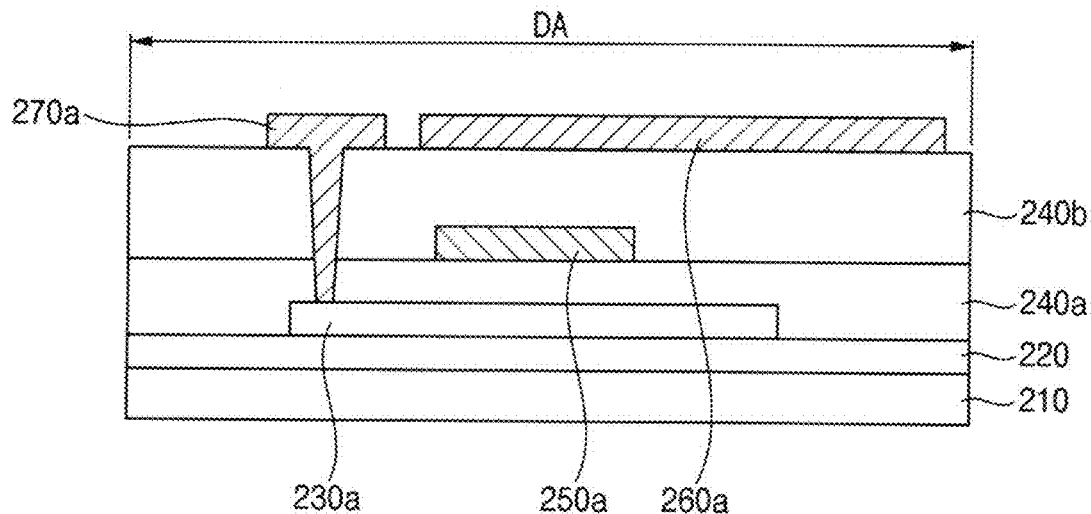
FIGS. 11, 12, 13, and 14 are cross-sectional views illustrating an embodiment of a method of manufacturing a display device.

Referring to FIG. 11, the substrate 210 may be provided. The buffer layer 220 may be disposed on the substrate 210.

The buffer layer 220 may be entirely disposed on the substrate 210. The first active layer 230a may be disposed on the buffer layer 220. In an embodiment, the first active layer 230a may include an oxide semiconductor, amorphous silicon, polysilicon, or an organic semiconductor, for example. The first gate insulating layer 240a may be disposed on the buffer layer 220 and the first active layer 230a. The first gate insulating layer 240a may be entirely disposed on the buffer layer 220. The first gate electrode 250a may be disposed on the first gate insulating layer 240a. In an embodiment, the first gate electrode 250a may be disposed on a portion of the first gate insulating layer 240a where the first active layer 230a is disposed below, for example. The first insulating layer 240b may be disposed on the first gate electrode 250a and the first gate insulating layer 240a. The first insulating layer 240b may be entirely disposed on the first gate insulating layer 240a. The first conductive pattern 260a may be disposed on the first insulating layer 240b. The first electrode 270a may be disposed on the first insulating layer 240b through a contact hole defined in the first gate insulating layer 240a and the first insulating layer 240b. The first electrode 270a may be connected to the first active layer 230a through a contact hole.

Figure 12:
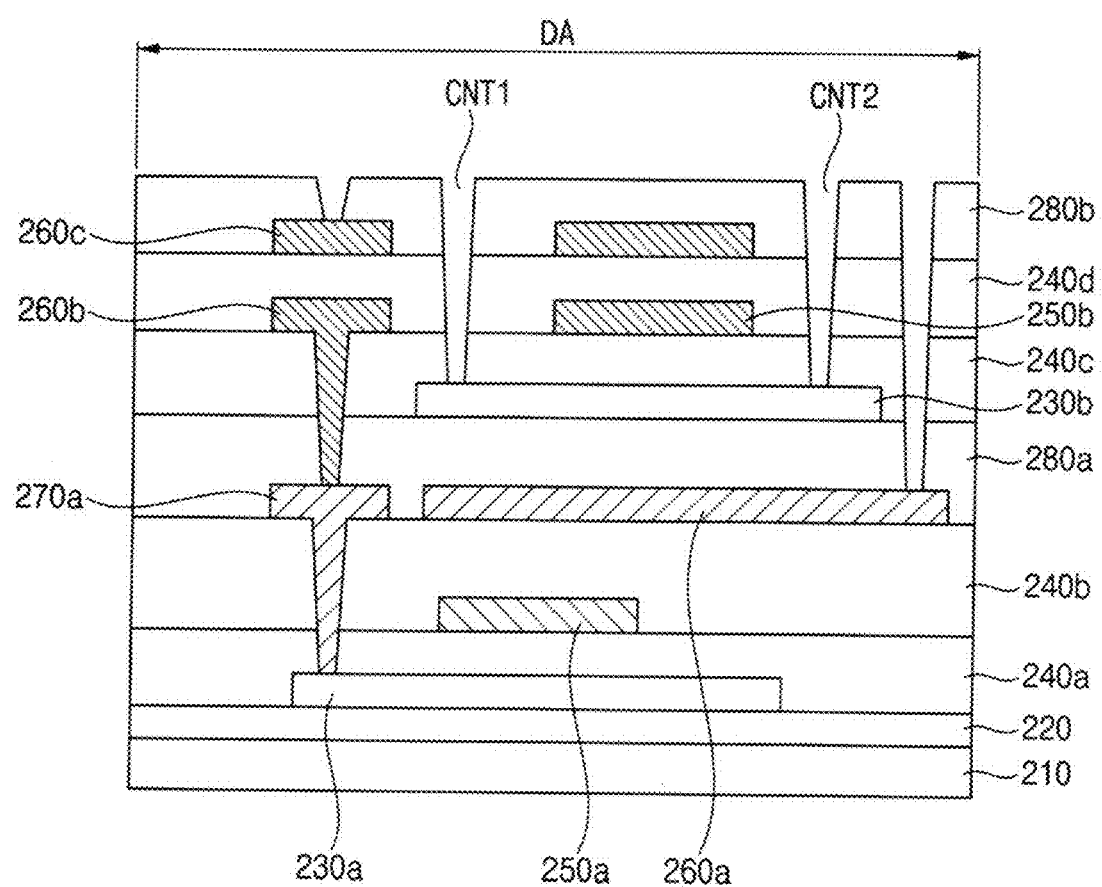

Referring to FIG. 12, the first inter-insulating layer 280a may be disposed on the first insulating layer 240b, the first electrode 270a, and the first conductive pattern 260a. The first inter-insulating layer 280a may be entirely disposed on the first insulating layer 240b. The second active layer 230b may be disposed on the first inter-insulating layer 280a. The second gate insulating layer 240c may be disposed on the second active layer 230b and the first inter-insulating layer 280a. The second gate insulating layer 240c may be entirely disposed on the first inter-insulating layer 280a.

The second gate electrode 250b may be disposed on the second gate insulating layer 240c. In an embodiment, the second gate electrode 250b may be disposed on a portion of the second gate insulating layer 240c in which the second active layer 230b is disposed below, for example. The second conductive pattern 260b may be disposed on the second gate insulating layer 240c. The second conductive pattern 260b may be connected to the first electrode 270a through a contact hole.

The second insulating layer 240d may be disposed on the second conductive pattern 260b, the second gate electrode 250b, and the second gate insulating layer 240c. The second insulating layer 240d may be entirely disposed on the second gate insulating layer 240c.

The third conductive pattern 260c may be disposed on the second insulating layer 240d. In an embodiment, the third conductive pattern 260c may be disposed on a portion of the second insulating layer 240d where the second conductive pattern 260b is disposed below, for example.

The second inter-insulating layer 280b may be disposed on the second insulating layer 240d and the third conductive pattern 260c. The second inter-insulating layer 280b may be entirely disposed on the second insulating layer 240d.

The contact hole exposing an upper surface of the third conductive pattern 260c may be defined by removing a portion of the second inter-insulating layer 280b. The first contact hole CNT1 and the second contact hole CNT2 exposing a first portion and a second portion of the second active layer 230b, respectively, may be defined by removing a portion of the second gate insulating layer 240c, the second insulating layer 240d, and the second inter-insulating layer 280b. The contact hole exposing an upper surface of the first conductive pattern 260a may be defined by removing a portion of the first inter-insulating layer 280a, the second gate insulating layer 240c, the second insulating layer 240d, and the second inter-insulating layer 280b.

Figure 13:
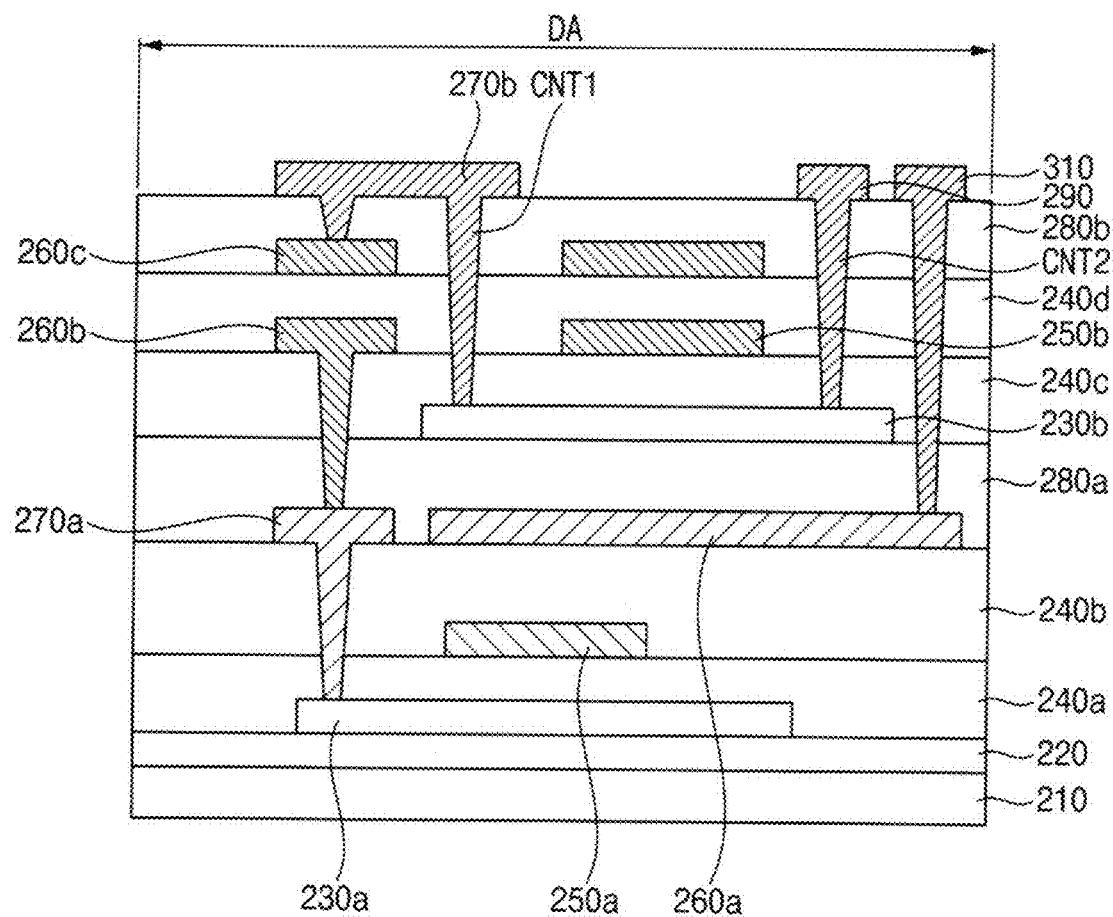

Referring to FIG. 13, the second electrode 270b may be disposed on the second inter-insulating layer 280b. The second electrode 270b may be connected to the first portion of the second active layer 230b through the first contact hole CNT1. The second electrode 270b may be electrically connected to the third conductive pattern 260c through the contact hole.

The data line 290 may be disposed on the second inter-insulating layer 280b. The data line 290 may be connected to the second portion of the second active layer 230b through the second contact hole CNT2.

The power line 310 may be disposed on the second inter-insulating layer 280b. The power line 310 may be connected to the first conductive pattern 260a through the contact hole.

Figure 14:
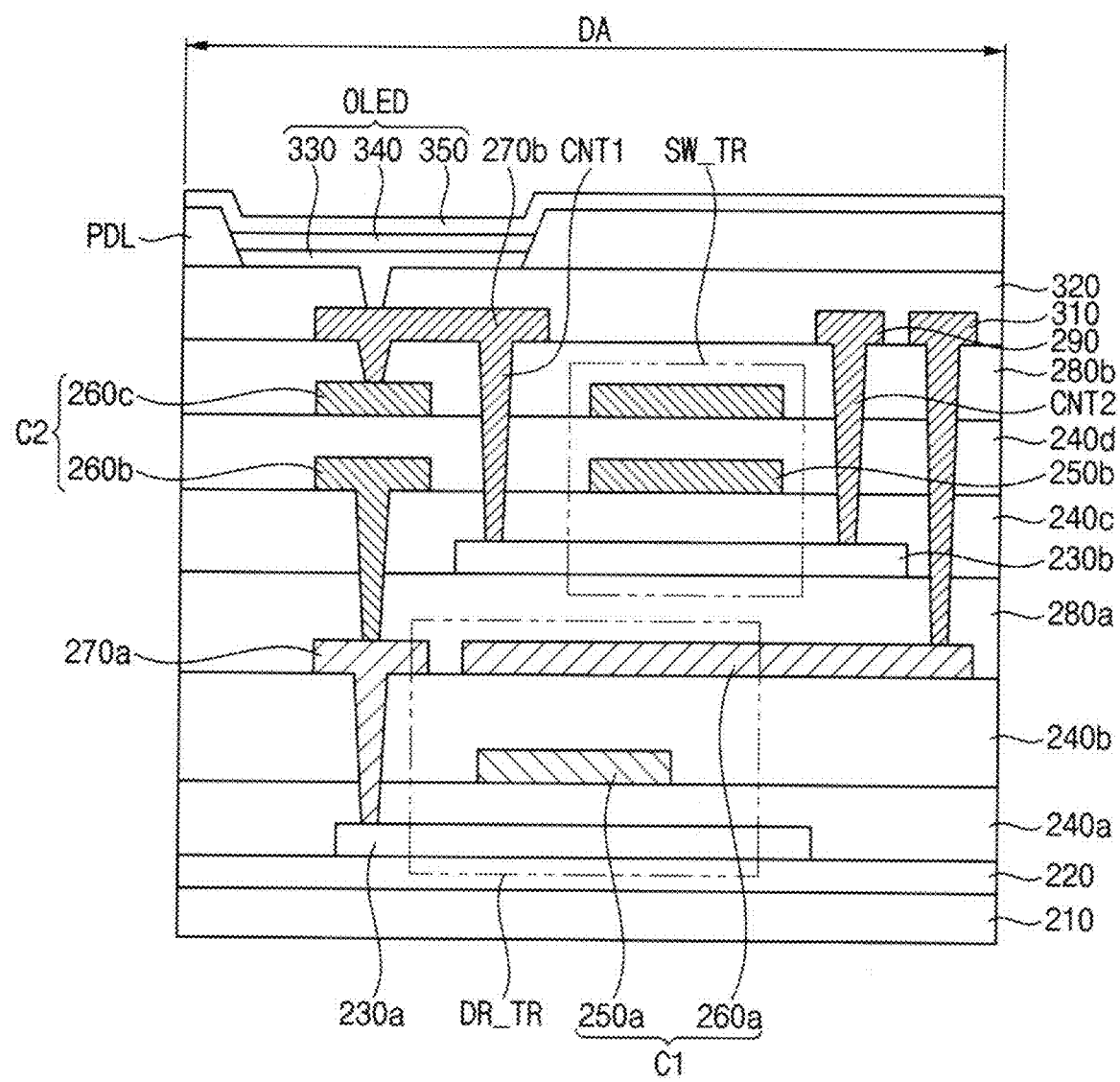

Referring to FIG. 14, the via layer 320 may be disposed on the second electrode 270b, the data line 290, the power line 310, and the second inter-insulating layer 280b. The via layer 320 may be entirely disposed on the second inter-insulating layer 280b.

The lower electrode 330 may be disposed on the via layer 320. The lower electrode 330 may be connected to the third conductive pattern 260c through the contact hole defined by removing a portion of the via layer 320. The pixel defining layer PDL may be disposed on the via layer 320. The pixel defining layer PDL may cover both sides of the lower electrode 330. The intermediate layer 340 may be disposed on the lower electrode 330 exposed by the pixel defining layer PDL. The upper electrode 350 may be disposed on the pixel defining layer PDL and the intermediate layer 340. The upper electrode 350 may be entirely disposed on the intermediate layer 340 and the pixel defining layer PDL.

Accordingly, the display device 100 shown in FIG. 4 may be manufactured.

Embodiments of the invention may be applied to various display devices including a display device. In an embodiment, the invention may be applicable to numerous display devices such as display devices for vehicles, ships and aircraft, portable communication devices, display devices for exhibition or information transfer, medical display devices, and the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the invention.

What is claimed is:

1. A display device comprising:
   a substrate;
   a first transistor disposed on the substrate and including a first gate electrode;
   a first conductive pattern disposed on the first gate electrode such that the first conductive pattern and the first gate electrode constitute a first capacitor;
   a second conductive pattern disposed on the first conductive pattern of the first capacitor;

a third conductive pattern disposed on the second conductive pattern such that the third conductive pattern and the second conductive pattern constitute a second capacitor; and a light emitting structure disposed on the second capacitor.

2. The display device of claim 1, further comprising:
a first insulating layer disposed between the first gate electrode and the first conductive pattern; and
a second insulating layer disposed between the second conductive pattern and the third conductive pattern.

3. The display device of claim 2, wherein a permittivity of the first insulating layer and a permittivity of the second insulating layer are different from each other.

4. The display device of claim 2, wherein a thickness of the first insulating layer and a thickness of the second insulating layer are different from each other.

5. The display device of claim 1, wherein the first transistor further includes:
a first active layer;
a first gate insulating layer disposed between the first active layer and the first gate electrode; and
a first electrode disposed on the first gate insulating layer and connected to the first active layer through a contact hole defined in the first gate insulating layer, and
wherein the second conductive pattern is electrically connected to the first electrode.

6. The display device of claim 1, further comprising:
a second transistor disposed on the first transistor.

7. The display device of claim 6, wherein the second transistor further includes:
a first active layer;
a first gate insulating layer disposed on the first active layer;
a second gate electrode disposed on the first gate insulating layer; and
a first electrode disposed on the second gate electrode and connected to a first portion of the first active layer through a first contact hole defined in the first gate insulating layer, and
wherein the third conductive pattern is electrically connected to the first electrode.

8. The display device of claim 7, further comprising:
a data line disposed in a same layer as the first electrode,
wherein the data line is connected to a second portion of the first active layer through a second contact hole defined in the first gate insulating layer.

9. The display device of claim 7, further comprising:
a power line disposed in a same layer as the first electrode,
wherein the power line is connected to the first conductive pattern through a second contact hole defined in the first gate insulating layer.

10. The display device of claim 7, wherein the light emitting structure includes:
a lower electrode;
an emission layer disposed on the lower electrode; and
an upper electrode disposed on the emission layer.

11. The display device of claim 10, further comprising:
a via layer disposed on the first electrode,
wherein the lower electrode is electrically connected to the first electrode through a contact hole defined in the via layer.

12. A display device comprising:
a substrate including a display area and a peripheral area surrounding the display area;
a first buffer transistor disposed in the peripheral area on the substrate and including a first gate electrode;
a first conductive pattern disposed on the first gate electrode such that the first conductive pattern and the first gate electrode constitute a first capacitor;
a second buffer transistor disposed on the first capacitor and including a second gate electrode;
a second conductive pattern disposed on the second gate electrode such that the second conductive pattern and the second gate electrode constitute a second capacitor; and
a light emitting structure disposed in the display area on the substrate.

13. The display device of claim 12, further comprising:
a first insulating layer disposed between the first gate electrode and the first conductive pattern; and
a second insulating layer disposed between the second gate electrode and the second conductive pattern.

14. The display device of claim 13, wherein a permittivity of the first insulating layer and a permittivity of the second insulating layer are different from each other.

15. The display device of claim 13, wherein a thickness of the first insulating layer and a thickness of the second insulating layer are different from each other.

16. The display device of claim 12, wherein the first buffer transistor further includes:
a first active layer; and
a first gate insulating layer disposed between the first active layer and the first gate electrode.

17. The display device of claim 12, wherein the second buffer transistor further includes:
a first active layer;
a first gate insulating layer disposed on the first active layer;
a first electrode disposed on the second conductive pattern and connected to the first active layer though a first contact hole defined in the first gate insulating layer, and
wherein the second conductive pattern is electrically connected to the first electrode.

18. The display device of claim 17, further comprising:
a second electrode disposed in a same layer as the first electrode,
wherein the first buffer transistor further includes a second active layer; and
the second electrode is connected to the second active layer through a second contact hole defined in the first gate insulating layer.

19. The display device of claim 12, wherein the light emitting structure includes:
a lower electrode;
an emission layer disposed on the lower electrode; and
an upper electrode disposed on the emission layer.

* * * * *